(12) United States Patent
Lu et al.

(10) Patent No.: US 10,480,058 B2
(45) Date of Patent: *Nov. 19, 2019

(54) COATED ARTICLE WITH LOW-E COATING HAVING PROTECTIVE DOPED SILVER LAYER FOR PROTECTING SILVER BASED IR REFLECTING LAYER(S), AND METHOD OF MAKING SAME

(71) Applicant: Guardian Glass, LLC, Auburn Hills, MI (US)

(72) Inventors: Yiwei Lu, Ann Arbor, MI (US); Brent Boyce, Novi, MI (US); Guowen Ding, Auburn Hills, MI (US); Scott Jewhurst, Auburn Hills, MI (US); Cesar Clavero, Auburn Hills, MI (US); Daniel Schweigert, Auburn Hills, MI (US); Guizhen Zhang, Auburn Hills, MI (US); Daniel Lee, Auburn Hills, MI (US)

(73) Assignee: GUARDIAN GLASS, LLC., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/293,911

(22) Filed: Mar. 6, 2019

(65) Prior Publication Data

US 2019/0203340 A1 Jul. 4, 2019

Related U.S. Application Data

(63) Continuation of application No. 15/446,026, filed on Mar. 1, 2017, now Pat. No. 10,233,531.

(51) Int. Cl.
*B32B 15/04* (2006.01)
*B32B 17/06* (2006.01)
(Continued)

(52) U.S. Cl.
CPC .............. *C23C 14/18* (2013.01); *C03C 17/34* (2013.01); *C03C 17/36* (2013.01); *C03C 17/366* (2013.01);
(Continued)

(58) Field of Classification Search
USPC ........ 428/426, 428, 432, 434, 688, 701, 702
See application file for complete search history.

(56) References Cited

U.S. PATENT DOCUMENTS

| 4,883,721 A | 11/1989 | Nalepka et al. |
| 5,059,295 A * | 10/1991 | Finley ..................... C03C 17/36 204/192.26 |

(Continued)

FOREIGN PATENT DOCUMENTS

| EP | 0 104 870 | 4/1984 |
| EP | 1 123 906 | 8/2001 |

(Continued)

OTHER PUBLICATIONS

U.S. Appl. No. 15/446,026, filed Mar. 1, 2017; Lu et al.

*Primary Examiner* — Lauren R Colgan

(57) ABSTRACT

A coated article includes a low emissivity (low-E) coating supported by a glass substrate. The low-E coating includes at least one silver (Ag) based infrared (IR) reflecting layer(s) that is provided adjacent to and contacting at least one protective metallic or substantially metallic doped silver layer in order to improve chemical durability characteristics of the low-E coating. The silver based IR reflecting layer and adjacent protective doped silver layer are part of a low emissivity (low-E) coating, and may be sandwiched between at least transparent dielectric layers. A barrier layer including Ni and/or Cr may be provided over and directly contacting the protective doped silver layer in order to further improve durability of the low-E coating.

20 Claims, 2 Drawing Sheets

(51) Int. Cl.
*C23C 14/18* (2006.01)
*C03C 17/36* (2006.01)
*C03C 17/34* (2006.01)

(52) U.S. Cl.
CPC ...... *C03C 17/3639* (2013.01); *C03C 17/3644* (2013.01); *C03C 17/3652* (2013.01); *C23C 14/185* (2013.01)

(56) References Cited

U.S. PATENT DOCUMENTS

| | | | |
|---|---|---|---|
| 5,344,718 A | | 9/1994 | Hartig et al. |
| 6,045,896 A | * | 4/2000 | Boire ............... C03C 17/36 204/192.23 |
| 6,398,925 B1 | * | 6/2002 | Arbab ............... C03C 17/36 204/192.22 |
| 6,576,349 B2 | | 6/2003 | Lingle et al. |
| 6,602,608 B2 | | 8/2003 | Stachowiak |
| 6,610,410 B2 | | 8/2003 | Ebisawa et al. |
| 7,153,579 B2 | | 12/2006 | Kriltz et al. |
| 7,241,506 B2 | | 7/2007 | Hartig |
| 7,390,572 B2 | | 6/2008 | Butz et al. |
| 8,679,634 B2 | * | 3/2014 | Imran ............... C03C 17/36 428/432 |
| 8,790,783 B2 | * | 7/2014 | Blacker ............ C03C 17/36 428/432 |
| 8,895,149 B2 | * | 11/2014 | Imran ............... C03C 17/36 428/432 |
| 8,945,714 B2 | | 2/2015 | Lao et al. |
| 9,028,956 B2 | | 5/2015 | Knoll et al. |
| 9,028,983 B2 | | 5/2015 | Imran et al. |
| 9,052,456 B2 | | 6/2015 | Hassan et al. |
| 9,212,417 B2 | | 12/2015 | Frank et al. |
| 9,297,197 B2 | | 3/2016 | Lao et al. |
| 9,315,414 B2 | | 4/2016 | Hassan et al. |
| 9,365,450 B2 | | 6/2016 | Ding et al. |
| 9,371,684 B2 | | 6/2016 | Butz et al. |
| 9,403,345 B2 | | 8/2016 | Lao et al. |
| 9,410,359 B2 | | 8/2016 | Ding et al. |
| 9,518,319 B2 | | 12/2016 | Ding et al. |
| 9,556,070 B2 | | 1/2017 | Wuillaume et al. |
| 10,233,531 B2 | | 3/2019 | Lu et al. |
| 2004/0247929 A1 | * | 12/2004 | Buhay ............ B32B 17/10036 428/621 |
| 2008/0311389 A1 | * | 12/2008 | Roquiny .......... C03C 17/36 428/336 |

FOREIGN PATENT DOCUMENTS

| | | |
|---|---|---|
| EP | 1 273 558 | 1/2003 |
| WO | WO 2004/110947 | 12/2004 |
| WO | WO 2015/071612 | 5/2015 |

* cited by examiner

COATED ARTICLE WITH LOW-E COATING HAVING PROTECTIVE DOPED SILVER LAYER FOR PROTECTING SILVER BASED IR REFLECTING LAYER(S), AND METHOD OF MAKING SAME

This application is a continuation of application Ser. No. 15/446,026, filed Mar. 1, 2017, the entire disclosure of which is hereby incorporated herein by reference.

This application relates in certain example embodiments to a coated article including at least one silver (Ag) based infrared (IR) reflecting layer(s) that is provided adjacent to and contacting at least one protective metallic or substantially metallic doped silver layer (e.g., AgZn) in order to improve thermal stability and/or chemical durability characteristics of the low-E coating. The silver based IR reflecting layer and adjacent protective doped silver layer are part of a low emissivity (low-E) coating, and may be sandwiched between at least transparent dielectric layers. A barrier layer including Ni and/or Cr may be provided over and directly contacting the protective doped silver layer in order to further improve durability of the low-E coating and reduce the likelihood of delamination upon chemical exposure. Such low-E coating may be used in applications such as monolithic windows, insulated glass (IG) window units, and the like.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like. In certain example instances, designers of coated articles often strive for a combination of high visible transmission, substantially neutral color, low emissivity (or emittance), low sheet resistance ($R_s$), low U-values in the context of IG window units, and/or low specific resistivity. High visible transmission and substantially neutral color may permit coated articles to be used in applications where these characteristics are desired such as in architectural or vehicle window applications, whereas low-emissivity (low-E), low sheet resistance, and low specific resistivity characteristics permit such coated articles to block significant amounts of IR radiation so as to reduce for example undesirable heating of vehicle or building interiors.

Low-E coatings having at least one silver based IR reflecting layer are known in the art. For example, see U.S. Pat. Nos. 5,344,718, 6,576,349, 8,945,714, 9,371,684, 9,028,956, 9,556,070, 8,945,714, 9,028,983, which are all hereby incorporated herein by reference. Low-E coatings on glass are widely used in commercial and residential buildings to save energy. The double Ag low-E coating is a dominant low-E product due to its excellent low emissivity properties and excellent control of solar heat gain.

However, conventional low-E coatings with silver IR reflecting layer(s) have problems associated with chemical durability and/or environmental durability which limit their applications. A reason is that the silver IR reflecting layers are not very stable, especially for double silver type low-E coatings. Once the Ag is decayed or damaged, the silver's optical, electrical, and thermal (emissivity) properties are degraded. For example, a solar control low-E coating with stack of glass/Si3N4/NiCr/Ag/NiCr/Si3N4 provides efficient solar control, but cannot reasonably survive chemical environments such as HCl acid environmental conditions.

While there are some durable low-E coatings in the market, their performances are poor especially with respect to undesirably low light-to-solar gain ratio (LSG) values of around 1.0 or less. The higher the LSG value, the more energy saved, so that high LSG values are desirable. LSG is calculated as $T_{vis}$/SHGC, where SHGC is according to NRFC 2001.

Example embodiments of this invention solve these problems by providing a low-E coating that has improved silver durability (e.g., chemical durability), while maintaining high LSG values. Example embodiments of this invention relate to a coated article with a low-E coating including at least one silver (Ag) based infrared (IR) reflecting layer(s) that is provided adjacent to and contacting at least one protective metallic or substantially metallic doped silver layer (e.g., AgZn) in order to improve chemical durability. The silver based IR reflecting layer and adjacent protective doped silver layer are part of a low emissivity (low-E) coating, and may be sandwiched between at least transparent dielectric layers. It has surprisingly and unexpectedly been found that providing the silver based IR reflecting layer directly under and contacting a doped silver layer provides for improved thermal stability, corrosion resistance and chemical durability of the silver based IR reflecting layer(s) and the overall low-E coating, while maintaining good optical and emissivity properties such as, when desired, high LSG values of at least 1.10 (more preferably at least 1.20, more preferably at least 1.30, and most preferably at least 1.60). A barrier layer including Ni and/or Cr may be provided over and directly contacting the protective doped silver layer in order to further improve durability of the low-E coating.

In an example embodiment of this invention, there is provided a coated article including a coating supported by a glass substrate, the coating comprising: a first dielectric layer on the glass substrate; an metallic or substantially metallic infrared (IR) reflecting layer comprising silver on the glass substrate located over at least the first dielectric layer; a protective layer comprising doped silver on the glass substrate located over and directly contacting the IR reflecting layer comprising silver; a second dielectric layer on the glass substrate located over at least the first dielectric layer, the IR reflecting layer comprising silver, and the protective layer comprising doped silver; wherein metal content of the protective layer comprising doped silver comprises from 80-99.5% Ag and from 0.5 to 20% dopant, atomic %, where the dopant is one or more of: Zn, Cu, Ni, W, Sn, Si, SiAl, ZnAl, ZnSi, ZnSiCu, and combinations thereof; and wherein the coating has a sheet resistance ($R_s$) of no greater than 11 ohms/square and a normal emissivity ($E_n$) of no greater than 0.2.

In certain example embodiments of this invention, there is provided a coated article including a coating supported by a glass substrate, the coating comprising: a first dielectric layer on the glass substrate; an metallic or substantially metallic infrared (IR) reflecting layer comprising silver on the glass substrate located over at least the first dielectric layer; a protective layer comprising doped copper on the glass substrate located over and directly contacting the IR reflecting layer comprising silver; a second dielectric layer on the glass substrate located over at least the first dielectric layer, the IR reflecting layer comprising silver, and the protective layer comprising doped copper; wherein metal content of the protective layer comprising doped copper comprises from 80-99.5% Cu and from 0.5 to 20% dopant, atomic %, where the dopant is one or more of: Zn, Ag, Ni, W, Sn, Si, SiAl, ZnAl, ZnSi, ZnSiCu, and combinations thereof; and wherein the coating has a sheet resistance ($R_s$) of no greater than 11 ohms/square and a normal emissivity ($E_n$) of no greater than 0.2.

In certain example embodiments of this invention, there is provided a method of making a coated article including a coating supported by a glass substrate, the method comprising: sputter depositing a first dielectric layer on the glass substrate; sputter depositing a metallic or substantially metallic infrared (IR) reflecting layer comprising silver on the glass substrate located over at least the first dielectric layer; sputter depositing a metallic or substantially metallic protective layer comprising doped silver on the glass substrate over and directly contacting the IR reflecting layer comprising silver, wherein metal content of the protective layer comprising doped silver as deposited comprises from 80-99.5% Ag and from 0.5 to 20% dopant, atomic %, where the dopant is one or more of: Zn, Cu, Ni, W, Sn, Si, SiAl, ZnAl, ZnSi, ZnSiCu, and combinations thereof; and after sputter depositing the metallic or substantially metallic protective layer comprising doped silver, sputter depositing a second dielectric layer on the glass substrate located over at least the first dielectric layer and the IR reflecting layer comprising silver, and wherein the coating has a sheet resistance ($R_s$) of no greater than 11 ohms/square and a normal emissivity ($E_n$) of no greater than 0.2.

DETAILED DESCRIPTION OF EXAMPLE EMBODIMENTS OF THE INVENTION

Figure 1:
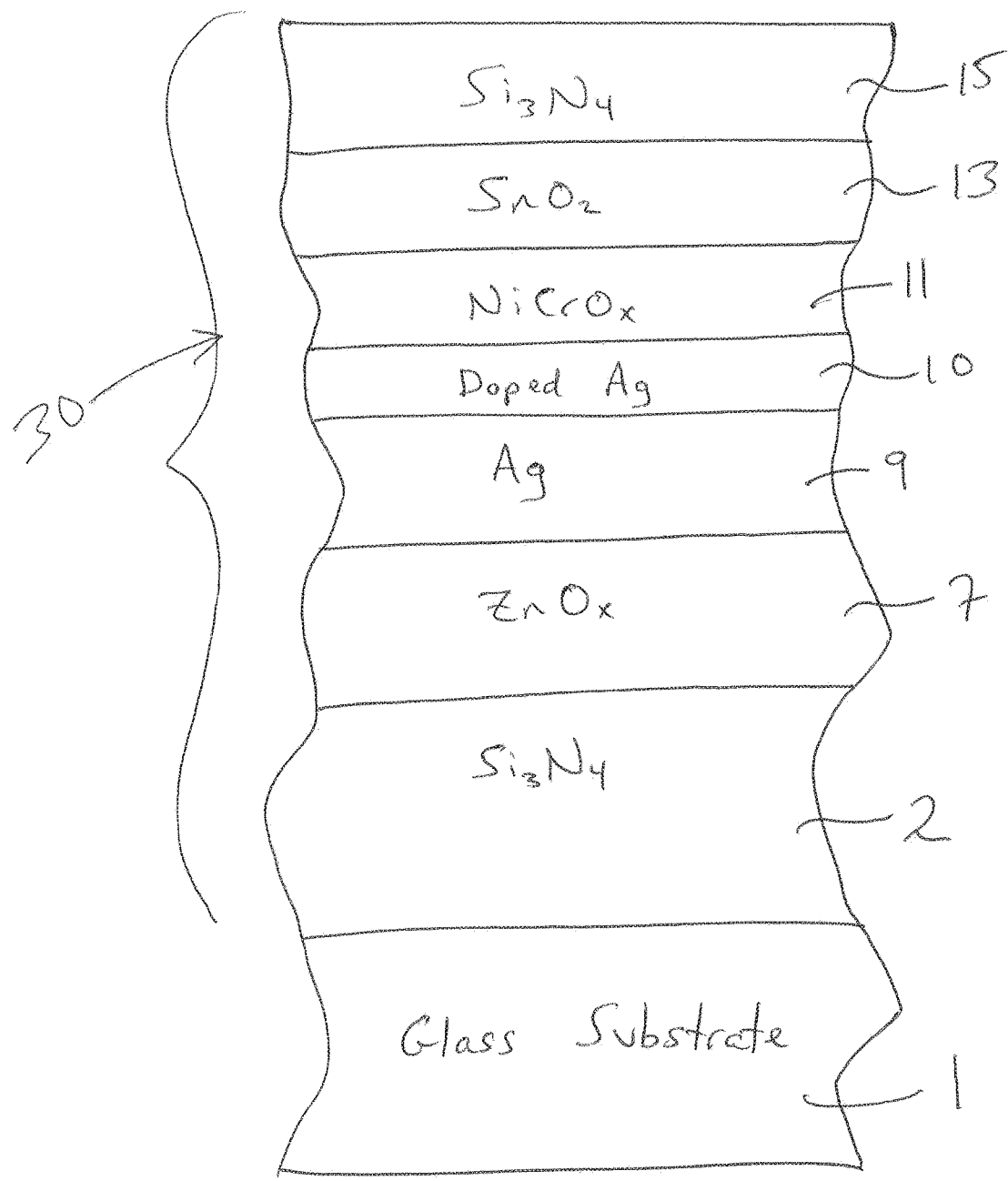
FIG. 1 is a cross sectional view of a coated article according to an example embodiment of this invention.

Referring now to the drawings in which like reference numerals indicate like parts throughout the several views.

Example embodiments of this invention relate to a coated article including a glass substrate 1 that supports a low-E coating 30, 40. The low-E coating 30, 40 is designed to have improved silver durability (e.g., chemical durability), while maintaining high LSG values. Example embodiments of this invention relate to a coated article with a low-E coating including at least one silver (Ag) based infrared (IR) reflecting layer(s) 9, 9' that is provided adjacent to and contacting at least one protective metallic or substantially metallic doped silver layer 10 (e.g., of or including AgZn, AgCu, AgNi, AgW, AgSn, AgSi, AgSiAl, AgZnAl, AgZnSi, AgZnSiCu, and/or their alloys) in order to improve chemical durability. Silver inclusive IR reflecting layers 9, 9' are preferably of different material than doped silver protective layer 10 in example embodiments of this invention, with IR reflecting layer 9, 9' preferably being of silver that is either not doped with any other metal, or only slightly doped as deposited due to possible crosstalk between sputtering chamber(s), and protective layer 10 being of silver that as deposited is intentionally doped with another metal(s) as explained herein. Moreover, protective doped silver layer 10 is preferably substantially thinner than the adjacent silver based IR reflecting layer 9, 9' in certain example embodiments of this invention, because this allows visible transmission to be increased. In certain example embodiments, protective doped silver layer 10 is at least 40 angstroms (Å) thinner (more preferably at least 50 Å thinner, even more preferably at least 75 Å thinner, and most preferably at least 100 Å thinner) than the adjacent silver based IR reflecting layer 9, 9'. The silver based IR reflecting layer 9, 9' and adjacent protective doped silver layer 10 are part of a low emissivity (low-E) coating 30, 40, and may be sandwiched between at least one transparent dielectric layers. It has surprisingly and unexpectedly been found that providing the silver based IR reflecting layer 9, 9' directly under and contacting a doped silver layer 10 provides for improved thermal stability, corrosion resistance and chemical durability of the silver based IR reflecting layer(s) 9 and the overall low-E coating 30, 40, while maintaining good optical and emissivity properties such as, when desired, high LSG values of at least 1.10 (more preferably at least 1.20, more preferably at least 1.30, and most preferably at least 1.60). Note that LSG values may be measured monolithically. A barrier layer 11, 26 including Ni and/or Cr may be provided over and directly contacting the protective doped silver layer 10 in order to further improve durability of the low-E coating. Such coated articles may be used in applications such as monolithic windows, insulated glass (IG) window units, and the like. Coated articles herein may optionally be heat treated (e.g., thermally tempered).

FIG. 1 is a cross sectional view of a coated article according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer low-E coating (or layer system) 30 provided on the substrate 1 either directly or indirectly. As shown in FIG. 1, the low-E coating 30 is of or includes transparent dielectric layer 2 of or including silicon nitride (e.g., $Si_3N_4$, or some other suitable stoichiometry), zinc oxide inclusive transparent dielectric layer 7 (e.g., $ZnO_x$ where "x" may be about 1; or $ZnAlO_x$), metallic or substantially metallic IR (infrared) reflecting layer 9 of or including silver, metallic or substantially metallic doped silver protective layer 10 provided directly on and contacting the silver IR reflecting layer 9, barrier layer 11 of or including an oxide and/or nitride of Ni and/or Cr (e.g., $NiCrO_x$), and an overcoat of or including tin oxide inclusive transparent dielectric layer 13 and silicon nitride inclusive transparent dielectric layer 15. The silicon nitride inclusive layers 2 and/or 15 may further include Al, oxygen, or the like, and the tin oxide layer 13 may likewise further include other materials such as nitrogen, zinc, or the like. Other layers and/or materials may also be provided in the coating in certain example embodiments of this invention, and it is also possible that certain layers may be removed or split in certain example instances. For example, a zirconium oxide overcoat layer (not shown) may be provided over layer 15 in certain example embodiments of this invention. Moreover, one or more of the layers discussed above may be doped with other materials in certain example embodiments of this invention.

Figure 2:
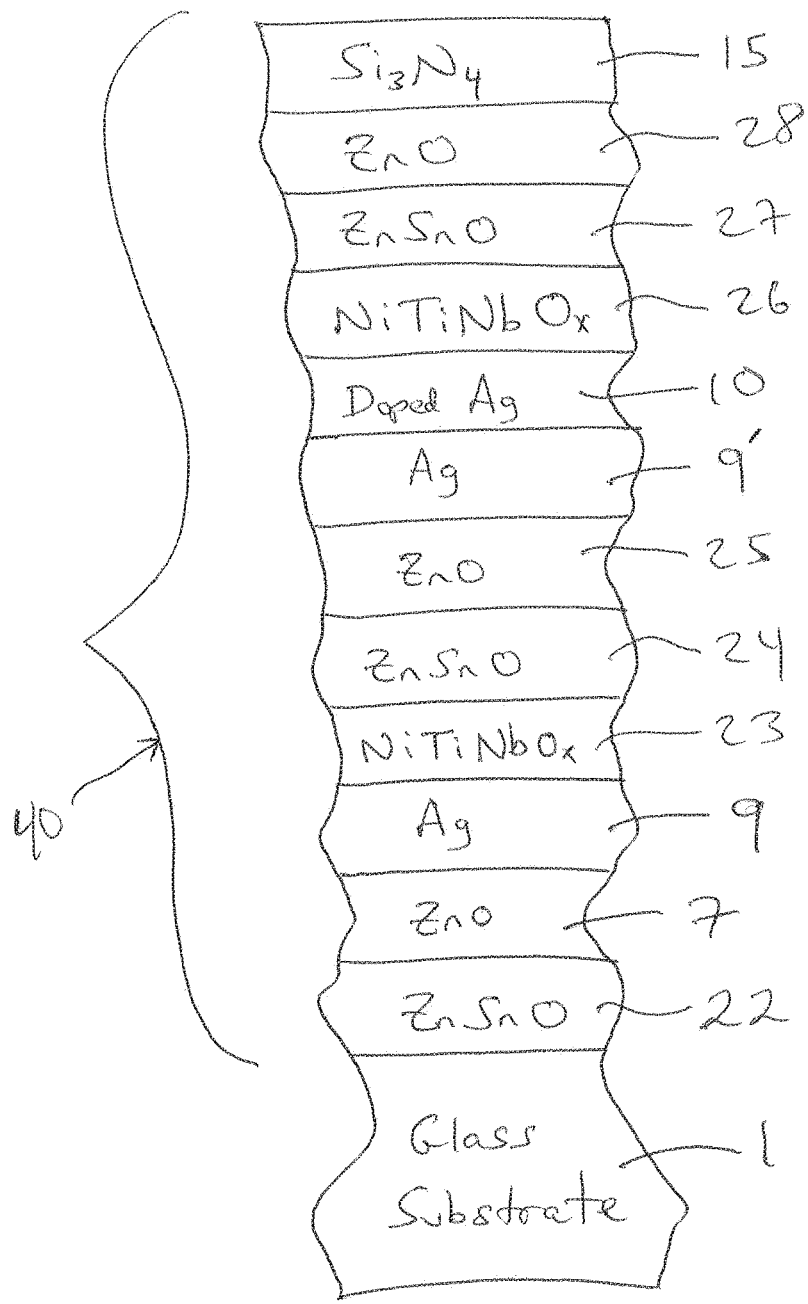
FIG. 2 is a cross sectional view of a coated article according to another example embodiment of this invention.

FIG. 2 is a cross sectional view of a coated article according to another example embodiment of this invention. In contrast with FIG. 1, the low-E coating 40 of FIG. 2 contains two spaced apart silver based IR reflecting layers 9 and 9', which IR reflecting layers 9 and 9' in FIG. 2 are spaced apart by layers 23-25. In both the FIG. 1 and FIG. 2 embodiments, the low-E coating includes at least one silver based IR reflecting layer provided adjacent to, under, and contacting a protective metallic or substantially metallic doped silver protective layer 10 in order to improve chemical durability of the low-E coating. In the low-E coating 40 of FIG. 2, the doped silver protective layer 10 is provided over and contacting the upper silver layer 9', but there is no such doped silver protective layer over and contacting the lower silver layer 9. In alternatives of the FIG. 2 double silver embodiment, respective doped silver protective layers 10 may be provided over and contacting both the upper silver IR reflecting layer 9' and the lower silver IR reflecting layer 9.

The low-E coating 40 illustrated in FIG. 2 is supported by glass substrate 1 (e.g., clear, green, bronze, or blue-green glass substrate from about 1.0 to 10.0 mm thick, more preferably from about 1.0 mm to 6.0 mm thick), and includes transparent dielectric layer of or including zinc stannate 22, transparent dielectric seed layer of or including zinc oxide or zinc stannate 7, metallic or substantially metallic lower silver based IR reflecting layer 9, barrier layer 23 over and directly contacting the lower IR reflecting layer 9 where the barrier layer 23 may be of or include NiCr, $NiCrN_x$, NiCrMo, $NiCrMoO_x$, $NiCrMoN_x$, $NiTiNbO_x$, nickel (Ni) oxide, chromium/chrome (Cr) oxide, $TiO_x$, or a nickel alloy oxide such as nickel chrome oxide ($NiCrO_x$), or other suitable material, transparent dielectric layer of or including zinc stannate 24, transparent dielectric seed layer of or including zinc oxide or zinc stannate 25, metallic or substantially metallic upper silver based IR reflecting layer 9', metallic or substantially metallic doped silver protective layer 10 provided directly on and contacting the upper silver IR reflecting layer 9', barrier layer 26 over and directly contacting the doped silver protective layer 10 where the barrier layer 26 may be of or include NiCr, $NiCrN_x$, NiCrMo, $NiCrMoO_x$, $NiCrMoN_x$, $NiTiNbO_x$, nickel (Ni) oxide, chromium/chrome (Cr) oxide, $TiO_x$, or a nickel alloy oxide such as nickel chrome oxide ($NiCrO_x$), or other suitable material, transparent dielectric layer 27 of or including zinc stannate, zinc oxide, tin oxide, or the like, transparent dielectric layer 28 of or including zinc oxide, tin oxide, or other suitable material, and transparent dielectric layer 15 of or including silicon nitride, silicon oxynitride, and/or other suitable material. The silicon nitride inclusive layer 15 may further include Al, oxygen, or the like. Other layers and/or materials may also be provided in the coating in certain example embodiments of this invention, and it is also possible that certain layers may be removed or split in certain example instances. For example, a zirconium oxide overcoat layer (not shown) may be provided over layer 15 in certain example embodiments of this invention. Moreover, one or more of the layers discussed above may be omitted from coating 40 or doped with other materials in certain example embodiments of this invention.

Conventional silver based low-E coatings have chemical durability issues as explained above, such as in the HCl and CASS solvents. Mechanisms for corrosion include galvanic corrosion and oxidation competition. Bimetallic corrosion occurs when two metals, with different potentials, are in electrical contact while in an electrically conducting corrosive liquid. The effect of two metals together increases the corrosion rate of the anode and reduces or even suppresses corrosion of the cathode. Thus the anode materials will be corroded much faster, and corrosion of the cathode is suppressed. In example embodiments of this invention, silver IR reflecting layer 9, 9' is at the cathode position, so that the cathode silver 9, 9' will be protected by the sacrificial anode material of protective layer 10. Doped silver layer 10 is provided as the direct neighbor of silver 9, 9' to protect silver of layer 9, 9' from chemical corrosion in low-E stacks according to example embodiments of this invention. As explained above, in the FIGS. 1 and 2 embodiments of this invention, the relatively thin metallic or substantially metallic doped silver protective layer 10 may be of or include AgZn, AgCu, AgNi, AgW, AgSn, AgSi, AgSiAl, AgZnAl, AgZnSi, AgZnSiCu, and/or combinations thereof.

Note that "substantially" metallic means metallic with no more than 10% oxygen content, more preferably no more than 5% oxygen content, atomic %. Substantially metallic layers 9, 9' and 10 may contain from 0-10% oxygen and/or nitrogen, more preferably from 0-5% oxygen and/or nitrogen (atomic %), most preferably from 0-2% oxygen and/or nitrogen, in example embodiments of this invention.

The dopant content in the Ag of protective layer 10 in FIGS. 1-2 is preferably kept low, and the thickness of protective layer 10 is preferably thin relative to the adjacent silver IR reflecting layer 9, 9', in order to reduce light absorption by protective layer 10 so that visible transmission of the coated article can be kept high if desired. In certain example embodiments of this invention, metal content of protective layer 10 in FIGS. 1-2 and other embodiments is preferably from 80-99.5% Ag, more preferably from 90-99% Ag, and most preferably from 95-99% Ag; and preferably from 0.5 to 20% dopant, more preferably from 1-10% dopant, and most preferably from 1-5% dopant, where the dopant is any of Zn, Cu, Ni, W, Sn, Si, SiAl, ZnAl, ZnSi, ZnSiCu, or combinations thereof. Thus, in certain example embodiments of this invention, metal content of protective layer 10 in FIGS. 1-2 and other embodiments is preferably from 80-99.5% Ag, more preferably from 90-99% Ag, and most preferably from 95-99% Ag; and preferably from 0.5 to 20% Zn, more preferably from 1-10% Zn, and most preferably from 1-5% Zn. In certain example embodiments of this invention, metal content of protective layer 10 in FIGS. 1-2 and other embodiments is preferably from 80-99.5% Ag, more preferably from 90-99% Ag, and most preferably from 95-99% Ag; and preferably from 0.5 to 20% Cu, more preferably from 1-10% Cu, and most preferably from 1-5% Cu. In certain example embodiments of this invention, metal content of protective layer 10 in FIGS. 1-2 and other embodiments is preferably from 80-99.5% Ag, more preferably from 90-99% Ag, and most preferably from 95-99% Ag; and preferably from 0.5 to 20% Ni, more preferably from 1-10% Ni, and most preferably from 1-5% Ni. In certain example embodiments of this invention, metal content of protective layer 10 in FIGS. 1-2 and other embodiments is preferably from 80-99.5% Ag, more preferably from 90-99% Ag, and most preferably from 95-99% Ag; and preferably from 0.5 to 20% W, more preferably from 1-10% W, and most preferably from 1-5% W. In certain example embodiments of this invention, metal content of protective layer 10 in FIGS. 1-2 and other embodiments is preferably from 80-99.5% Ag, more preferably from 90-99% Ag, and most preferably from 95-99% Ag; and preferably from 0.5 to 20% Sn, more preferably from 1-10% Sn, and most preferably from 1-5% Sn. In certain example embodiments of this invention, metal content of protective layer 10 in FIGS. 1-2 and other embodiments is preferably from 80-99.5% Ag, more preferably from 90-99% Ag, and most preferably from 95-99% Ag; and preferably from 0.5 to 20% Si, more preferably from 1-10% Si, and most preferably from 1-5% Si. Protective layer(s) 10, as deposited such as via sputter-deposition, are preferably metallic or substantially metallic with no more than 10% oxygen content, more preferably no more than 5% oxygen content, atomic %. If an oxide layer such as $NiCrO_x$ 11 (or layer 26) is sputter-deposited over layer 10, then it is possible that layer 10 may become oxided to some extent during the deposition of layer 11 thereover. However, if layer 11 (or layer 26) is not an oxide layer, and instead is a nitride layer, then its deposition should not cause any significant oxiding of layer 10.

In monolithic instances, the coated article includes only one substrate such as glass substrate 1 (see FIGS. 1-2). However, monolithic coated articles herein may be used in devices such as IG window units for example which include multiple glass substrates. Example IG window units are illustrated and described, for example, in U.S. Pat. Nos. 5,770,321, 5,800,933, 6,524,714, 6,541,084 and U.S. 2003/0150711, the disclosures of which are all hereby incorporated herein by reference. An example IG window unit may include, for example, the coated glass substrate 1 shown in FIGS. 1-2 coupled to another glass substrate via spacer(s), sealant(s) or the like with a gap being defined therebetween. This gap between the substrates in IG unit embodiments may in certain instances be filled with a gas such as argon (Ar). An example IG unit may comprise a pair of spaced apart substantially clear glass substrates each about 3-4 mm thick one of which is coated with a coating herein in certain example instances, where the gap between the substrates may be from about 5 to 30 mm, more preferably from about 10 to 20 mm, and most preferably about 12-16 mm. In certain example instances, the coating may be provided on the side of the inner or outer glass substrate 1 facing the gap.

Silicon nitride inclusive transparent dielectric layer 2 is provided for antireflection purposes, and have been found to allow color shifts to be reduced. Silicon nitride layer 2 may be of or include $Si_3N_4$. Alternatively, the silicon nitride layer 2 may be of the Si-rich type (not fully stoichiometric). Moreover, one or both of the silicon nitride layers 2 and/or 15 may further include a dopant such as aluminum or stainless steel, and/or small amounts of oxygen. These layers may be deposited via sputtering in certain example embodiments, or via any other suitable technique. It is possible that other materials such as titanium oxide, zinc stannate, or tin oxide may be used for transparent dielectric layer(s) 2 and/or 15.

Transparent dielectric seed layer 7 is of or includes zinc oxide (e.g., ZnO) in the FIG. 1 and FIG. 2 embodiments. The zinc oxide of layer(s) 7 may contain other materials as well such as Al (e.g., to form $ZnAlO_x$) in certain example embodiments. For example, in certain example embodiments of this invention, zinc oxide layer 7 may be doped with from about 1 to 10% Al (or B), more preferably from about 1 to 5% Al (or B), and most preferably about 2 to 4% Al (or B). The use of zinc oxide 7 under the silver in layer 9 allows for an excellent quality of silver to be achieved. In certain example embodiments (e.g., to be discussed below) the zinc oxide inclusive layer 7 may be formed via sputtering a ceramic ZnO or metal rotatable magnetron sputtering target. It has been found that the use of the ceramic target in certain example embodiments (e.g., of ZnO, which may or may not be doped with Al, F or the like) allows for a high quality of silver to be provided thereby resulting in a lower emissivity coating. While the ZnO in the ceramic target may be stoichiometric in certain example embodiments, at least one substoichiometric ceramic target comprising $ZnO_x$ (e.g., where $0.25 \leq x \leq 0.99$, more preferably $0.50 \leq x \leq 0.97$, and even more preferably $0.70 \leq x \leq 0.96$) may instead be used in sputter-depositing a zinc oxide inclusive layer 7 which may be substoichiometric in certain instances. It is possible that other materials such as zinc stannate, NiCr, $NiCrN_x$, $NiCrMoN_x$ or $NiCrO_x$ may be used for layer 7 in alternative embodiments of this invention.

Still referring to FIGS. 1-2, transparent infrared (IR) reflecting layers 9 and 9' are preferably conductive and metallic or substantially metallic, and preferably comprise or consist essentially of silver (Ag). IR reflecting layers 9 and 9' are not doped with other metal(s) in preferred embodiments of this invention. IR reflecting layers 9 and 9' help allow the coating to have low-E and/or good solar control characteristics such as low emittance, low sheet resistance, and so forth. In certain example embodiments, silver (Ag) IR reflecting layers 9 and 9' are located over transparent dielectric zinc oxide inclusive seed layers 7, 25, and one or both of layer(s) 9, 9' are located under and directly contacting a silver doped proactive layer 10.

Still referring to FIGS. 1-2, barrier layers 11 and 26 may be of or include an oxide of Ni and/or Cr, or may be metallic and of or include Ni and/or Cr and may be nitride for example. In certain example embodiments, barrier layers 11 and/or 26 may each be of or include NiCr, $NiCrN_x$, NiCrMo, $NiCrMoO_x$, $NiCrMoN_x$, $NiTiNbO_x$, nickel (Ni) oxide, chromium/chrome (Cr) oxide, $TiO_x$, or a nickel alloy oxide such as nickel chrome oxide ($NiCrO_x$), or other suitable material. Layers 11 and 26 may contain about 0-20% nitrogen, more preferably from about 1-10% nitrogen, in certain example embodiments of this invention. Layers 11 and 26 may or may not be oxidation graded in different embodiments of this invention. Oxidation grading means that the degree of oxidation in the layer changes through the thickness of the layer so that for example a barrier layer may be graded so as to be less oxidized at the contact interface with the immediately adjacent layer 10 than at a portion of the barrier layer further or more/most distant from the doped silver protective layer 10. It is surprisingly been found that the presence of barrier layers 11 and 26 over and directly contacting the doped silver protective layer 10 improves chemical durability of the low-E coating, reducing the likelihood of delamination upon chemical exposure.

An example overcoat, such as shown in FIG. 1, may be of or include transparent dielectric layers 13 and/or 15 in certain example embodiments. Dielectric layer 13 may be of or include a metal oxide such as tin oxide in certain example embodiments of this invention. Metal oxide inclusive layer 13, such as tin oxide or zinc stannate, is provided for antireflection purposes, and also improves the emissivity of the coated article and the stability and efficiency of the manufacturing process. The tin oxide inclusive layer 13 may be doped with other materials such as nitrogen and/or zinc in certain example embodiments of this invention. The tin oxide based layer 13 provides good durability and improves light transmission. Dielectric layer 15 may be of or include silicon nitride (e.g., $Si_3N_4$ or other suitable stoichiometry) or any other suitable material in certain example embodiments of this invention such as silicon oxynitride. Silicon nitride layer 15 may further include other material, such as aluminum as a dopant or small amounts of oxygen in certain example embodiments of this invention. Optionally, other layers such as a zirconium oxide overcoat may be provided above layer 15 in the overcoat in certain example instances. Layer 15 is provided for durability purposes, and to protect the underlying layers. In certain example embodiments, silicon nitride based layer 15 may have an index of refraction (n) of from about 1.9 to 2.2, more preferably from about 1.95 to 2.05. In certain example embodiments, Zr may be provided in the silicon nitride of layer 15 (or layer 2 or layer 5). Thus, one or more of layers 2 and/or 15 may be of or include SiZrNx and/or zirconium oxide in certain example embodiments of this invention.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses may be used in different embodiments of this invention, example thicknesses and materials for the respective layers on the glass substrate 1 in the FIG. 1 embodiment are as follows, from the glass substrate outwardly (e.g., the Al content in the zinc oxide layer and the silicon nitride layers may be from about 1-10%, more preferably from about 1-3% in certain example instances). Note that in Tables 1-2 the barrier layers 11, 23 and 26 may be of or include any of the suitable materials discussed above such as NiCr, $NiCrN_x$, NiCrMo, $NiCrMoO_x$, $NiCrMoN_x$, $NiTiNbO_x$, nickel (Ni) oxide, chromium/chrome (Cr) oxide, $TiO_x$, or a nickel alloy oxide such as nickel chrome oxide ($NiCrO_x$). And in Tables 1-2 doped silver protective layer 10 may be of or include AgZn, AgCu, AgNi, AgW, AgSn, AgSi, AgSiAl, AgZnAl, AgZnSi, AgZnSiCu, and/or combinations thereof

TABLE 1

(Example Materials/Thicknesses; FIG. 1 Embodiment)

| Layer | Preferred Range (Å) | More Preferred (Å) | Example (Å) |
|---|---|---|---|
| $Si_xN_y$ (layer 2) | 20-300 Å | 60-160 Å | 135 Å |
| $ZnAlO_x$ (layer 7) | 10-200 Å | 35-120 Å | 40-90 Å |
| Ag (layer 9) | 40-170 Å | 60-155 Å | 80-145 Å |
| Doped Ag (layer 10) | 3-70 Å | 5-25 Å | 8-15 Å |
| Barrier (layer 11) | 10-70 Å | 20-50 Å | 25-40 Å |
| $SnO_2$ (layer 13) | 50-300 Å | 160-180 Å | 170 Å |
| $Si_xN_y$ (layer 15) | 100-800 Å | 150-600 Å | 500 Å |

While various thicknesses may be used in different embodiments of this invention, example thicknesses and materials for the respective layers on the glass substrate 1 in the FIG. 2 embodiment are as follows, from the glass substrate outwardly (e.g., the Al content in the zinc oxide layer and the silicon nitride layers may be from about 1-10%, more preferably from about 1-3% in certain example instances).

TABLE 2

(Example Materials/Thicknesses; FIG. 2 Embodiment)

| Layer | Preferred Range (Å) | More Preferred (Å) | Example (Å) |
|---|---|---|---|
| $ZnSnO_x$ (layer 22) | 80-800 Å | 250-450 Å | 335 Å |
| $ZnAlO_x$ (layer 7) | 10-200 Å | 30-120 Å | 40-90 Å |
| Ag (layer 9) | 40-170 Å | 60-155 Å | 80-145 Å |
| Barrier (layer 23) | 10-70 Å | 20-50 Å | 25-40 Å |
| $ZnSnO_x$ (layer 24) | 100-1100 Å | 500-900 Å | 745 Å |
| $ZnAlO_x$ (layer 25) | 10-200 Å | 30-120 Å | 40-90 Å |
| Ag (layer 9') | 40-170 Å | 60-155 Å | 80-145 Å |
| Doped Ag (layer 10) | 3-70 Å | 5-25 Å | 8-15 Å |
| Barrier (layer 26) | 10-70 Å | 20-50 Å | 25-40 Å |
| $ZnSnO_x$ (layer 27) | 40-400 Å | 50-200 Å | 80 Å |
| $ZnAlO_x$ (layer 28) | 10-250 Å | 20-120 Å | 20-50 Å |
| $Si_xN_y$ (layer 15) | 100-800 Å | 150-600 Å | 200 Å |

It has surprisingly and unexpectedly been found that providing the silver based IR reflecting layer 9, 9' directly under and contacting a doped silver layer 10 provides for improved corrosion resistance, thermal stability, and chemical durability of the silver based IR reflecting layer(s) 9, 9' and the overall low-E coating 30, 40, while maintaining good optical and emissivity properties such as, when desired, high LSG values. The dopant content in the Ag of protective layer 10 is preferably kept low, and the thickness of doped silver protective layer 10 is preferably substantially thinner than the adjacent silver IR reflecting layer 9, 9', in order to reduce light absorption by protective layer 10 so that visible transmission of the coated article can be kept high if desired. In the FIGS. 1 and 2 embodiments, for example, protective doped silver layer 10 is preferably substantially thinner than the adjacent silver based IR reflecting layer 9, 9' in certain example embodiments of this invention, because this allows visible transmission to be increased. In certain example embodiments, protective doped silver layer 10 is at least 40 angstroms (Å) thinner (more preferably at least 50 Å thinner, even more preferably at least 75 Å thinner, and most preferably at least 100 Å thinner) than the adjacent silver based IR reflecting layer 9, 9'.

It has also been surprisingly found that the presence of barrier layers 11 and 26 over the protective doped silver layer 10 are particularly important to durability. The presence of barrier layers 11 and 26, in combination with the protective doped silver layer 10 over a silver based IR reflecting layer 9, 9', unexpectedly improved chemical durability of the low-E coating in a surprising manner. When the barrier layers 11, 26 were not present, delamination can occur upon chemical testing.

In certain example embodiments of this invention, coated articles herein (e.g., see FIGS. 1-2) may have the following low-E (low emissivity), solar and/or optical characteristics set forth in Table 3 when measured monolithically, before and/or after any optional heat treatment such as thermal tempering.

TABLE 3

Low-E/Solar Characteristics (Monolithic; FIG. 1-2 Embodiments)

| Characteristic | General | More Preferred | Most Preferred |
|---|---|---|---|
| $R_s$ (ohms/sq.): | <=11.0 | <=10 | <=9 |
| $E_n$: | <=0.2 | <=0.15 | <=0.11 |
| $T_{vis}$ (%): | >=40 | >=50 | >=70 |
| LSG: | >=1.10 | >=1.20 | >=1.30 (or >=1.60) |

While the combination of IR reflecting layer 9 (or 9') and silver doped protective layer 10 is used in the low-E coatings of FIGS. 1 and 2 in certain example embodiments of this invention discussed herein, it is possible to use the combination of IR reflecting layer 9 (or 9') and silver doped protective layer 10 described herein in other low-E coatings. For example and without limitation, silver based IR reflecting layer(s) in the low-E coatings in any of U.S. Pat. Nos. 5,344,718, 6,576,349, 8,945,714, 9,371,684, 9,028,956, 9,556,070, 8,945,714, and/or 9,028,983 (which are all hereby incorporated herein by reference) may be replaced with the combination of IR reflecting layer 9 and doped silver protective layer 10 discussed herein in example embodiments of this invention. In other words, for example, the silver based IR reflecting layer(s) in any of U.S. Pat. Nos. 5,344,718, 6,576,349, 8,945,714, 9,371,684, 9,028,956, 9,556,070, 8,945,714, and/or 9,028,983 may be replaced with a silver based IR reflecting layer 9 and doped silver protective layer 10 as discussed herein.

In alternative embodiments of this invention, protective layer 10 in any embodiment described herein may be based on Cu instead of Ag. In other words, metallic or substantially metallic protective layer 10 may be doped Cu. Thus, in certain example embodiments of this invention, metal content of protective layer 10 in FIGS. 1-2 and other embodiments may be from 80-99.5% Cu, more preferably from 90-99% Cu, and most preferably from 95-99% Cu; and preferably from 0.5 to 20% dopant, more preferably from 1-10% dopant, and most preferably from 1-5% dopant, where the dopant is any of Zn, Ag, Ni, W, Sn, Si, SiAl, ZnAl, ZnSi, ZnSiAg, or combinations thereof.

Example 1 as shown in FIG. 2, according to an example embodiment of this invention, and a Comparative Example (CE), were made and tested. Example 1 and the CE each had the same low-E coating 40, except that an AgZn protective layer 10 (97% Ag, and 3% Zn) was present in Example 1 but was not present in the Comparative Example (CE). The layer thicknesses for the CE and Example 1 are as follows, with thicknesses in nm.

TABLE 4

(Layer thicknesses of Ex. 1 and CE, thickness in nm)

|  | CE | Ex. 1 |
| --- | --- | --- |
| Si3N4 (layer 15) | 20 | 20 |
| ZnO (layer 28) | 3 | 3 |
| ZnSnO (layer 27) | 8 | 8 |
| NiTiNbOx (layer 26) | 2.9 | 2.9 |
| AgZn 3% (layer 10) | 0 | 1 |
| Ag (layer 9') | 14.5 | 13.5 |
| ZnO (layer 25) | 4 | 4 |
| ZnSnO (layer 24) | 74.5 | 74.5 |
| NiTiNbOx (layer 23) | 2.9 | 2.9 |
| Ag (layer 9) | 11 | 11 |
| ZnO (layer 7) | 4 | 4 |
| ZnSnO (layer 22) | 33.5 | 33.5 |
| Glass (3.0 mm) |  |  |

Optical and thermal data for Example 1 and the CE are as follows, after the same heat treatment (HT) at at least 600 degrees C. for at least eight minutes. Note that in the chart below "normal emissivity" stands for normal emmisivity/emittance ($E_n$).

TABLE 5

(Optical and Thermal Data for Ex. 1 and CE; post-HT)

|  |  |  | Example 1 HT | CE HT |
| --- | --- | --- | --- | --- |
| Monolithic 3 mm clear | T | Y (%) | 84 | 84.6 |
|  |  | a* | −3.15 | −1.51 |
|  |  | b* | 2.88 | 1.35 |
|  | Rg | Y (%) | 6.2 | 6.5 |
|  |  | a* | 3.07 | −3.86 |
|  |  | b* | −9.77 | −2.11 |
|  | Rf | Y (%) | 5.2 | 5.7 |
|  |  | a* | −1.1 | −6.9 |
|  |  | b* | −4 | 2.3 |
|  | A[vis] (100-TT-Rf) |  | 10.8 | 9.7 |
|  | A[vis] (100-TT-Rg) |  | 9.8 | 8.9 |
| IGU* 6 mm clear/coating/12.7 mm air/6 mm clear | T | Y (%) | 75.2 | 75.8 |
|  |  | a* | −4.71 | −3.21 |
|  |  | b* | 3.14 | 1.73 |
|  | Rg | Y (%) | 11.7 | 12.1 |
|  |  | a* | 0.16 | −3.67 |
|  |  | b* | −5.76 | −1.04 |
|  | Rf | Y (%) | 12 | 12.4 |
|  |  | a* | −1.8 | −4.4 |
|  |  | b* | −2.1 | 0.9 |

TABLE 5-continued (Optical and Thermal Data for Ex. 1 and CE; post-HT)

|  |  | Example 1 HT | CE HT |
| --- | --- | --- | --- |
|  | Normal Emissivity | 1% | 1% |
| NFRC 2004 | Tvis (%) | 75.24 | 75.78 |
| IGU* | Tsol (%) | 34.99 | 38.2 |
|  | Rsol (%) | 42.39 | 39.58 |
|  | Asol (%) | 22.63 | 22.22 |
|  | Uval | 0.282 | 0.279 |
|  | SHGC | 0.39 | 0.42 |
|  | LSG | 1.94 | 1.79 |

After the HT, there were noticeable differences between Example 1 and the CE. In particular, the coating of the CE had at least five (5) times as many defects in it after the HT compared to the coating of Example 1. Thus, it has been demonstrated that the addition of the doped silver protective layer 10 over silver IR reflecting layer 9' surprisingly improves thermal stability of the coating.

Additionally, the same corrosion test was then performed on Example 1 and the Comparative Example (CE), in order to test their respective corrosion/durability characteristics. The testing was a high humidity (85%) and high temperature (85 degrees C.) (HHHT) two day test. The differences between Example 1 and the CE following this testing were pronounced and surprising. After the HHHT test, the CE had many more, and much worse, defects than Example 1. It could be seen via the microscope that Example 1 was much more durable in the HHHT test than was the CE. Thus, it has also been demonstrated that the addition of the doped silver protective layer 10 over silver IR reflecting layer 9' surprisingly improves durability of the coating.

In an example embodiment of this invention, there is provided a coated article including a coating supported by a glass substrate, the coating comprising: a first dielectric layer on the glass substrate; an metallic or substantially metallic infrared (IR) reflecting layer comprising silver on the glass substrate located over at least the first dielectric layer; a protective layer comprising doped silver on the glass substrate located over and directly contacting the IR reflecting layer comprising silver; a second dielectric layer on the glass substrate located over at least the first dielectric layer, the IR reflecting layer comprising silver, and the protective layer comprising doped silver; wherein metal content of the protective layer comprising doped silver comprises from 80-99.5% Ag and from 0.5 to 20% dopant, atomic %, where the dopant is one or more of: Zn, Cu, Ni, W, Sn, Si, SiAl, ZnAl, ZnSi, ZnSiCu, and combinations thereof and wherein the coating has a sheet resistance ($R_s$) of no greater than 11 ohms/square and a normal emissivity ($E_n$) of no greater than 0.2.

In the coated article of the immediately preceding paragraph, metal content of the protective layer comprising doped silver may comprise from 90-99% Ag and from 1 to 10% dopant, atomic %, where the dopant is one or more of: Zn, Cu, Ni, W, Sn, Si, SiAl, ZnAl, ZnSi, ZnSiCu, and combinations thereof.

In the coated article of any of the preceding two paragraphs, metal content of the protective layer comprising doped silver may comprise from 95-99% Ag and from 1 to 5% dopant, atomic %, where the dopant is one or more of: Zn, Cu, Ni, W, Sn, Si, SiAl, ZnAl, ZnSi, ZnSiCu, and combinations thereof In the coated article of any of the preceding three paragraphs, the IR reflecting layer may consist or consist essentially of silver.

In the coated article of any of the preceding four paragraphs, the IR reflecting layer may be metallic.

In the coated article of any of the preceding five paragraphs, the protective layer comprising doped silver may be metallic or substantially metallic.

In the coated article of any of the preceding six paragraphs, the coated article may have a visible transmission of at least 40%, more preferably of at least 50%, and most preferably of at least 70%.

In the coated article of any of the preceding seven paragraphs, the coated article may have a light-to-solar gain ratio (LSG) of at least 1.10, more preferably of at least 1.30, and even more preferably of at least 1.60.

In the coated article of any of the preceding eight paragraphs, the dopant may comprise Zn, and metal content of the protective layer comprising doped silver may comprise from 90-99% Ag and from 1 to 10% Zn, atomic %; more preferably from 95-99% Ag and from 1 to 5% Zn, atomic %.

In the coated article of any of the preceding nine paragraphs, the dopant may comprise Cu, and metal content of the protective layer comprising doped silver may comprise from 90-99% Ag and from 1 to 10% Cu, atomic %; more preferably from 95-99% Ag and from 1 to 5% Cu, atomic %.

In the coated article of any of the preceding ten paragraphs, the dopant may comprise Ni, and wherein metal content of the protective layer comprising doped silver may comprise from 90-99% Ag and from 1 to 10% Ni, atomic %; more preferably from 95-99% Ag and from 1 to 5% Ni, atomic %.

In the coated article of any of the preceding eleven paragraphs, the dopant may comprise W, and wherein metal content of the protective layer comprising doped silver may comprise from 90-99% Ag and from 1 to 10% W, atomic %; more preferably from 95-99% Ag and from 1 to 5% W, atomic %.

In the coated article of any of the preceding twelve paragraphs, the dopant may comprise Sn, and wherein metal content of the protective layer comprising doped silver may comprise from 90-99% Ag and from 1 to 10% Sn, atomic %; more preferably from 95-99% Ag and from 1 to 5% Sn, atomic %.

In the coated article of any of the preceding thirteen paragraphs, the dopant may comprise Si, and wherein metal content of the protective layer comprising doped silver may comprise from 90-99% Ag and from 1 to 10% Si, atomic %; more preferably from 95-99% Ag and from 1 to 5% Si, atomic %.

In the coated article of any of the preceding fourteen paragraphs, the dopant may comprise Zn and Cu, and metal content of the protective layer comprising doped silver may comprise from 80-99% Ag and from 0.5 to 10% of each of Zn and Cu, atomic %.

In the coated article of any of the preceding fifteen paragraphs, the dopant may comprise Zn and Si, and metal content of the protective layer comprising doped silver may comprise from 80-99% Ag and from 0.5 to 10% of each of Zn and Si, atomic %.

In the coated article of any of the preceding sixteen paragraphs, the coated article may be thermally tempered.

In the coated article of any of the preceding seventeen paragraphs, the protective layer comprising doped silver may be at least 40 Å thinner than is the IR reflecting layer comprising silver, more preferably at least 75 Å thinner, and even more preferably at least 100 Å thinner.

In the coated article of any of the preceding eighteen paragraphs, the protective layer comprising doped silver may be from about 3-70 Å thick, and/or the IR reflecting layer comprising silver may be from about 40-170 Å thick.

In the coated article of any of the preceding nineteen paragraphs, the protective layer comprising doped silver may be from about 5-25 Å thick, and/or the IR reflecting layer comprising silver may be from about 60-155 Å thick.

In the coated article of any of the preceding twenty paragraphs, the protective layer comprising doped silver may be from about 8-15 Å thick, and/or the IR reflecting layer comprising silver may be from about 80-145 Å thick.

In the coated article of any of the preceding twenty one paragraphs, the first dielectric layer may comprise silicon nitride.

In the coated article of any of the preceding twenty two paragraphs, the coating may have a sheet resistance (Rds.) of no greater than 9 ohms/square and a normal emissivity ($E_n$) of no greater than 0.11.

In the coated article of any of the preceding twenty three paragraphs, the coating may further comprise another infrared (IR) reflecting layer comprising silver that is spaced apart from and does not contact the protective layer comprising doped silver.

In the coated article of any of the preceding twenty four paragraphs, the coating may further comprise a dielectric layer comprising zinc oxide located under and directly contacting the IR reflecting layer comprising silver.

In the coated article of any of the preceding twenty five paragraphs, the coating may further comprise a barrier layer comprising Ni and/or Cr located over and directly contacting the protective layer comprising doped silver. The barrier layer may comprise a nitride of Ni and/or Cr.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article including a coating supported by a glass substrate, the coating comprising:
   a first dielectric layer on the glass substrate;
   an metallic or substantially metallic infrared (IR) reflecting layer comprising silver on the glass substrate located over at least the first dielectric layer;
   a protective layer comprising doped silver on the glass substrate located over and directly contacting the IR reflecting layer comprising silver;
   a second dielectric layer on the glass substrate located over at least the first dielectric layer, the IR reflecting layer comprising silver, and the protective layer comprising doped silver;
   wherein metal content of the protective layer comprising doped silver comprises from 80-99.5% Ag and from 0.5 to 20% dopant, atomic %, where the dopant is one or more of: Zn, Ni, ZnAl, ZnSi, ZnSiCu, and combinations thereof; and
   wherein the coating has a sheet resistance ($R_s$) of no greater than 11 ohms/square and a normal emissivity ($E_n$) of no greater than 0.2.

2. The coated article of claim 1, wherein metal content of the protective layer comprising doped silver comprises from 90-99% Ag and from 1 to 10% dopant, atomic %, where the dopant is one or more of: Zn, Ni, ZnAl, ZnSi, ZnSiCu, and combinations thereof.

3. The coated article of claim 1, wherein metal content of the protective layer comprising doped silver comprises from 95-99% Ag and from 1 to 5% dopant, atomic %, where the dopant is one or more of: Zn, Ni, ZnAl, ZnSi, ZnSiCu, and combinations thereof.

4. The coated article of claim 1, wherein the IR reflecting layer consists essentially of silver.

5. The coated article of claim 1, wherein the IR reflecting layer is metallic.

6. The coated article of claim 1, wherein the protective layer comprising doped silver is metallic or substantially metallic.

7. The coated article of claim 1, wherein the coated article has a visible transmission of at least 50%.

8. The coated article of claim 1, wherein the coated article has a light-to-solar gain ratio (LSG) of at least 1.10.

9. The coated article of claim 1, wherein the dopant comprises Zn, and wherein metal content of the protective layer comprising doped silver comprises from 90-99% Ag and from 1 to 10% Zn, atomic %.

10. The coated article of claim 1, wherein the dopant comprises Zn, and wherein metal content of the protective layer comprising doped silver comprises from 95-99% Ag and from 1 to 5% Zn, atomic %.

11. The coated article of claim 1, wherein the dopant comprises Ni, and wherein metal content of the protective layer comprising doped silver comprises from 90-99% Ag and from 1 to 10% Ni, atomic %.

12. The coated article of claim 1, wherein the dopant comprises Zn and Cu, and wherein metal content of the protective layer comprising doped silver comprises from 80-99% Ag and from 0.5 to 10% of each of Zn and Cu, atomic %.

13. The coated article of claim 1, wherein the dopant comprises Zn and Si, and wherein metal content of the protective layer comprising doped silver comprises from 80-99% Ag and from 0.5 to 10% of each of Zn and Si, atomic %.

14. The coated article of claim 1, wherein the coated article is thermally tempered.

15. The coated article of claim 1, wherein the protective layer comprising doped silver is at least 75 Å thinner than is the IR reflecting layer comprising silver.

16. The coated article of claim 1, wherein the protective layer comprising doped silver is from about 5-25 Å thick, and the IR reflecting layer comprising silver is from about 60-155 Å thick.

17. The coated article of claim 1, wherein the first dielectric layer comprises silicon nitride.

18. The coated article of claim 1, wherein the coating further comprises another infrared (IR) reflecting layer comprising silver that is spaced apart from and does not contact the protective layer comprising doped silver.

19. A coated article including a coating supported by a glass substrate, the coating comprising:
 a first dielectric layer on the glass substrate;
 an metallic or substantially metallic infrared (IR) reflecting layer comprising silver on the glass substrate located over at least the first dielectric layer;
 a protective layer comprising doped silver on the glass substrate located over and directly contacting the IR reflecting layer comprising silver;
 a second dielectric layer on the glass substrate located over at least the first dielectric layer, the IR reflecting layer comprising silver, and the protective layer comprising doped silver;
 wherein metal content of the protective layer comprising doped silver comprises from 80-99.5% Ag and from 0.5 to 20% Zn atomic %; and
 wherein the coating has a sheet resistance ($R_s$) of no greater than 11 ohms/square and a normal emissivity ($E_n$) of no greater than 0.2.

20. A coated article including a coating supported by a glass substrate, the coating comprising:
 a first dielectric layer on the glass substrate;
 an metallic or substantially metallic infrared (IR) reflecting layer comprising silver on the glass substrate located over at least the first dielectric layer;
 a protective layer comprising doped silver on the glass substrate located over and directly contacting the IR reflecting layer comprising silver;
 a second dielectric layer on the glass substrate located over at least the first dielectric layer, the IR reflecting layer comprising silver, and the protective layer comprising doped silver;
 wherein metal content of the protective layer comprising doped silver comprises from 80-99.5% Ag and from 0.5 to 20% Ni, atomic %; and
 wherein the coating has a sheet resistance ($R_s$) of no greater than 11 ohms/square and a normal emissivity ($E_n$) of no greater than 0.2.

\* \* \* \* \*